United States Patent [19]

Broersma

[11] Patent Number: 4,518,258

[45] Date of Patent: May 21, 1985

[54] COLOUR ANALYSER

[76] Inventor: Harmen Broersma, Amsterdam, Netherlands

[21] Appl. No.: 276,365

[22] PCT Filed: Oct. 15, 1980

[86] PCT No.: PCT/NL80/00033

§ 371 Date: Jun. 19, 1981

§ 102(e) Date: Jun. 19, 1981

[87] PCT Pub. No.: WO81/01203

PCT Pub. Date: Apr. 30, 1981

[51] Int. Cl.$^3$ ............... G01N 21/25; G01J 1/42; G01J 1/44

[52] U.S. Cl. ................... 356/405; 356/406; 356/223; 356/227

[58] Field of Search ............. 356/404, 405, 406, 416, 356/72, 218, 223, 236, 227, 226; 355/38

[56] References Cited

U.S. PATENT DOCUMENTS

| | | | |
|---|---|---|---|
| 2,203,036 | 6/1940 | Van Briessen et al. | 356/406 |
| 3,097,563 | 7/1963 | Weisglass | 356/404 |
| 3,408,142 | 10/1968 | Hunt et al. | 356/404 |
| 3,819,275 | 6/1974 | Aimi et al. | 355/38 X |
| 4,025,190 | 5/1977 | Hughes | 356/226 X |
| 4,125,330 | 11/1978 | Schild | 356/416 |
| 4,140,391 | 2/1979 | Laciak et al. | 355/38 |
| 4,194,838 | 3/1980 | Bey et al. | 356/227 |

FOREIGN PATENT DOCUMENTS

| | | |
|---|---|---|
| 2409909 | 9/1975 | Fed. Rep. of Germany . |
| 2608450 | 6/1977 | Fed. Rep. of Germany . |
| 2390333 | 12/1978 | France . |
| 7306374 | 11/1973 | Netherlands . |
| 531760 | 1/1973 | Switzerland . |

Primary Examiner—Vincent P. McGraw
Assistant Examiner—S. A. Turner
Attorney, Agent, or Firm—Cushman, Darby & Cushman

[57] ABSTRACT

A color analyser measuring the light intensities of at least three different colors within the spectrum of the incident light, and relating these measurements to values programmmed before. Those color components of the incident light that have to be influenced in order to conform to the preprogrammed relations are indicated by means of a color star, consisting of three rows of light sources (23, 24, 25) of appropriate colors. While influencing the color of the light with correction filters the operator views the change simultaneously at the color star. It is indicated in such a way that the light sources of the color star are extinguished as soon as the preprogrammed relations between the colors are satisfied, notwithstanding the absolute value of light intensity. An automatic exposure time meter is built in, also controlling an electronic timer (32).

1 Claim, 2 Drawing Figures

COLOUR ANALYSER

The invention relates to a colour analyser comprising an indicating instrument consisting of three light scales. The principal purpose of the instrument is to present an indication of a necessary color correction, for colour recording or reproduction purposes. The field of application comprises, among other things, colour photography and colour television.

The embodiment as described is principally designed for use in combination with an enlarger for enlarging colour negatives and transparencies. Such enlargers are usually equipped with three continuously variable colour correction filters. The colour analyser provides a means to determine which correction filters have to be engaged and to what density, to correct for the colour imbalance in the negative or transparency used. Besides this, a time determining circuit may be added to the analyser, for indicating the correct exposure time for a print or an enlargement.

Colour analysers are usually provided with one light sensitive cell. Blue, green and red filters can subsequently be placed in front of this cell, for measuring the respective yellow, magenta and cyan corrections. A suchlike embodiment has been described in U.S. Pat. No. 4,125,330. A disadvantage of this measuring method is the time consuming process of the sequential colour switching and measuring, and also the fact that due to counter absorptions in the correction filters one or two repeated complete measuring cycles are required. These disadvantages are offset in the embodiment of my invention because it is provided with at least three measuring cells, the signals of these cells being simultaneously transmitted.

Another colour analyser with three different cells is known from U.S. Pat. No. 3,819,275. A disadvantage of last said analyser, and equally of other known embodiments lies in the necessity to read one or more measuring instruments. The operator is asked to read and interpret three quantities in order to get to a correct filter setting, for every exposure again, with the added difficulty of being in a darkroom. My invention reduces the complicacy of the measurement in a new way, namely by indicating the filters by a lighted colour star, presenting in each case an image of one or two vectors of coloured light, describing the complete colour circle.

Figure 1:
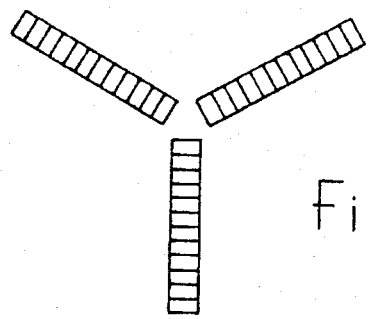
FIG. 1 is a representation of three rows of light emitting diodes which form the colour star.

The colour star thereby exists of three rows of coloured light sources, such as light emitting diodes, each row in an appropriate colour, and placed under mutual angles of 120 degrees, i.e. as indicated in FIG. 1.

From one glance the operator can tell which filter knobs to engage at the enlarger, because the analyser indicates them by coloured lights. These coloured lights are extinguished gradually as the operator increases the filter density, until all lights are completely darkened when the correct density is reached.

The indicators may consist of any number of lights and the indication needs no linear relation to the corresponding filter density. As it only needs to show an accurate zero indication it may minimally comprise only one light per indicator. Hence it follows that the colour star is more than a simple system of three indicating instruments. It is actually a single instrument, showing a vectorial indication of the colour inbalance. Therefor the colour star can only function together with its specially designed signal processor unit. This unit converts the three originally measured signals into three other signals, that provide an immediately recognisable indication for the correction filters needed, if displayed vectorially.

Figure 2:
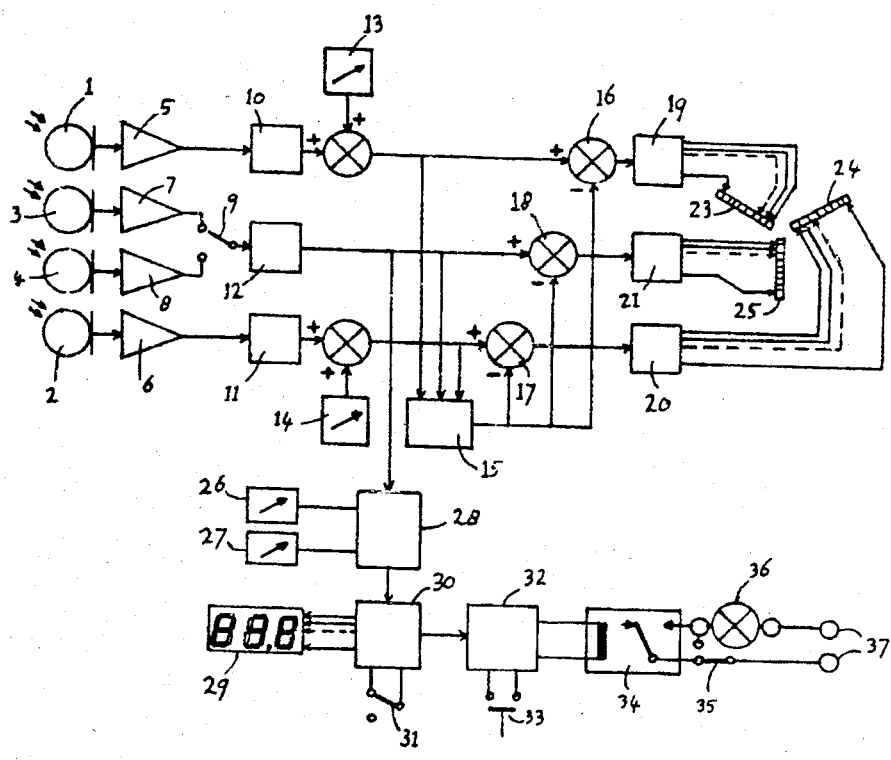
FIG. 2 is a block diagram of the preferred embodiment of the invention.

The operation of a colour analyser according to my invention will be described hereunder in conjunction with the block diagram of FIG. 2.

Its four measuring cells 1, 2, 3, and 4 may be either photodiodes or photomultiplier tubes. The cells are provided with respective blue, green, orange-red, and dark red filters. Sensitive preamplifiers, indicated by 5, 6, 7, and 8 are needed if photodiodes are used, because of their lower sensitivity. Switch 9 chooses between the two different red-sensitive cells. The darkred sensitive cell 4 is engaged for enlarging negatives, and the orange-red sensitive cell 3 for transparencies. Thus the color sensitivity of the analyser is changed accordingly to the type of enlarging paper used, as is necessary for accurate results.

The three preamplifier signals, to be called B, G and R respectively, are converted into three signals logB, logG, and logR by logarithmic amplifiers 10, 11, and 12. Constant voltages $logP_b$ and $logP_g$, both adjustable through programmer potentiometers 13 and 14, are added to the signals logB and logG. Said potentiometers are to be programmed by the operator in such a way that the relation $logB.P_b = logG.P_g = logR$ is satisfied when the exposure of the measuring cells 1, 2, 3, and 4 is colour corrected according to the requirements. The need for programming by the operator is due to differences in the relative colour sensitivities of the three colour dyes of different brands and batches of photographic paper, also depending upon the types of developer to be used. For programming the operator needs only one test negative of which the correction filters and exposure time are obtained experimentally, by trail and error method.

An analog comparator 15 selects the smallest of the three signals $logB.P_b$ and $logG.P_g$ and logR. The selected signal will be termed Smallest logColor. The summing points 16, 17, and 18 subtract the Smallest logColor from the three signals from which it is choosen, resulting in three new signals, to be termed Y, M, C. At least one of last said signals equals zero, because it is obtained by substracting a factor from its own value. If i.e. logR is smaller than $logB.P_b$ and $logG.P_g$ then logR will become Smallest logColor and the summing point 18 will yield a signal C equalling zero. This means that the red part of the measured light spectrum is relatively weaker and so it needs no further reduction by cyan correction filtering. Signals Y and M are then proportional to the yellow and magenta correction filter densities needed, because they are proportional to the logarithmic density relation of the blue and green components, compared to the red component of the light. As soon as last siad filter densities will be applied the three signals Y, M, and C will automatically become zero.

This is clearly demonstrated to the operator because each of last said signals is visualised in a proportional light scale by means of light indicators 23, 24, and 25, which together constitute the colour star. The indicators are controlled by amplifiers 19, 20, and 21.

A preferred embodiment of my invention also contains an automatic exposure time meter. This will also be described underneath in conjunction with FIG. 2.

The same measuring signals of the analyser can be applied as input signals to the exposure time meter. As the analyser will steadily operate in such a way that at the correct colour balance a fixed relation exists between 3, G, and R, it is sufficient to use only one of the colour signals, instead of the sum or average of the three signals. In the described embodiment signal logR from the logarithmic amplifier 12 is used. It is converted by an inverter and exponential amplifier 28 into a signal $S \cdot 10^{-logR}$, which is equal to (S/R). The operator can influence the proportional factor S through the sensitivity potentiometer 26. Like potentiometers 13 and 14 also 26 must be adjusted to correct for the specific sensitivities of enlarging paper and developer chemicals.

Many photosensitive materials require an exposure time that is inversely proportional to the exposing light intensity. In those cases signal (S/R) is directly proportional to the required exposure time. This exposure time is then displayed by display unit 29, preferably digital, and controlled by an analog to digital converter 30. This AtoD converter is provided with a hold-switch 31, enabling the operator to store the exposure time measured at the end of each measurement.

The stored signal is transported to a timer 32, engaging relay 34 for the duration of the exposure time, after a start pulse is given with switch 33. A switch 35 enables the operator to to switch the enlarger either on, for adjusting and measuring, or off, to allow handling of the photosensitive material in complete darkness. Only said last condition of switch 35 allows relay 34 to switch the enlarger 36. Power for the enlarger, usually from the electric mains, is applied at the power terminals 37.

A reciprocity regulator 27, i.e. a switch or potentiometer, is added to the inverter and exponential amplifier 28, allowing multiplication of the signal logR by a variable factor, ranging at least from 1.0 to 1.2, before the exponent of $-logR$ is taken.

Said factor being adjusted to 1.0 results in the exposure time being inversely proportional to the light intensity, as described before. Many enlarging papers for color however need a certain added extension of the exposure time in order to maintain equal density when low light intensities are used. This means that their sensitivity gradually decreases at lower light intensities. Experiments have shown that an even density can be maintained over an extended range of exposing time, namely from 2 to 100 seconds, by adjusting regulator 27 to a factor of 1.2.

What I claim is:

1. A colour analyser for measuring the relative intensities of a plurality of frequency components of light, comprising:

sensor means for simultaneously developing a plurality of signals respectively proportional to the intensities of a plurality of frequency components of light;

means operative on said proportional signals for determining which one represents the frequency component having the least intensity and for subtracting that one signal from at least each of the other ones of said proportional signals;

display means for simultaneously displaying the results of said subtractions;

additional circuitry that converts one or more signals of the analyser automatically into an indication of an exposure time needed to properly expose photosensitive materials; and regulator means for permitting an operator to program said conversion for photosensitive materials having different reciprocity characteristics, said regulating means including means for setting the quotient of the logarithm of a measured light intensity divided by the logarithm of said exposure time to at least two different values, namely 1.0 and 1.2.

* * * * *